(12) United States Patent
Shibata et al.

(10) Patent No.: US 6,998,760 B2
(45) Date of Patent: Feb. 14, 2006

(54) SURFACE ACOUSTIC WAVE DEVICE AND COMMUNICATION DEVICE

(75) Inventors: Osamu Shibata, Ishikawa-ken (JP); Yoichi Sawada, Ishikawa-ken (JP)

(73) Assignee: Murata Manufacturing Co., LTD, Kyoto (JP)

( * ) Notice: Subject to any disclaimer, the term of this patent is extended or adjusted under 35 U.S.C. 154(b) by 22 days.

(21) Appl. No.: 10/269,368

(22) Filed: Oct. 12, 2002

(65) Prior Publication Data

US 2004/0000839 A1 Jan. 1, 2004

(30) Foreign Application Priority Data

Oct. 12, 2001 (JP) .......................................... 2001-315161

(51) Int. Cl.
*H03H 9/145* (2006.01)
*H03H 9/25* (2006.01)

(52) U.S. Cl. ............................... 310/313 R; 310/313 A; 310/313 B; 310/313 C; 310/313 D; 310/328; 333/193

(58) Field of Classification Search ............. 310/313 A, 310/313 B, 313 C, 313 D, 313 R, 323; 333/193
See application file for complete search history.

(56) References Cited

U.S. PATENT DOCUMENTS

| 4,950,935 | A | * | 8/1990 | Furukawa | ................ | 310/313 R |
| 5,485,052 | A | * | 1/1996 | Seki et al. | ............... | 310/313 B |
| 5,568,002 | A | | 10/1996 | Kawakatsu et al. | ..... | 310/313 B |
| 5,790,000 | A | * | 8/1998 | Dai et al. | ................... | 333/193 |

| 6,667,673 | B1 | | 12/2003 | Strauss |

FOREIGN PATENT DOCUMENTS

| EP | 0 836 278 | | 4/1998 |
| EP | 1 168 613 | A2 | 1/2002 |
| EP | 1 244 212 | A2 | 9/2002 |
| EP | 1 249 934 | A2 | 10/2002 |
| EP | 1 251 638 | A2 | 10/2002 |
| JP | 10-117123 | | 5/1998 |
| JP | 2000077969 | A * | 3/2000 |
| JP | 2000-341074 | | 12/2000 |
| JP | 2001-308672 | | 11/2001 |
| JP | 2003-507917 | | 2/2003 |
| JP | 2003078387 | A * | 3/2003 |
| JP | 2003179458 | A * | 6/2003 |
| WO | WO 01/13514 | | 2/2001 |

OTHER PUBLICATIONS

Japanese Notification of Reasons for Rejection with full English translation, issued in the corresponding Japanese Application No. 2001–315161, dispatched on Sep. 6, 2005.
English translation of the Japanese Notification of Reasons for Rejection dated May 24, 2005 and issued in Japanese Patent Application No. 2001–315161.

* cited by examiner

*Primary Examiner*—Darren Schuberg
*Assistant Examiner*—J. Aguirrechea
(74) *Attorney, Agent, or Firm*—Keating & Bennett, LLP

(57) ABSTRACT

A surface acoustic wave device includes at least four surface acoustic wave elements that are arranged to have an unbalanced-to-balanced conversion function. In a surface acoustic wave element on the balanced side, the phase between the input and output terminals is 180 degrees shifted so that the phase difference between the outputs on the balanced side becomes substantially 180 degrees.

11 Claims, 13 Drawing Sheets

SURFACE ACOUSTIC WAVE DEVICE AND COMMUNICATION DEVICE

BACKGROUND OF THE INVENTION

1. Field of the Invention

The present invention relates to a surface acoustic wave device having an unbalanced-to-balanced ("balun") conversion function, for use in, for example, filters and other apparatuses, and a communication device including such a surface acoustic wave device.

2. Description of the Related Art

In recent years, in order to obtain high performance high-frequency circuits to be used in communication devices such as portable telephones, there is a movement to make such high-frequency circuits balanced ones. In this case, the electronic components of the high-frequency circuits which can accommodate balanced circuits are needed. Although there is a balun as an electronic component having terminals for conversion between unbalanced and balanced circuits, since the number of electronic components increases, the development of electronic components having an additional unbalanced-to-balanced conversion function has been carried out. In the electronic components having an unbalanced-to-balanced conversion function, it is required that the amplitude balance is 0 dB and the phase difference showing the phase balance is close to 180 degrees.

A surface acoustic wave device, which can be made smaller as the frequency to be handled in the high-frequency circuit increases, can be used as the above-mentioned electronic component. Although not illustrated, the above surface acoustic wave device contains one or a plurality of comb-shaped electrode portions, that is, interdigital transducers hereinafter referred to as IDTs) and two reflectors on the left and right sides along the propagation direction of a surface acoustic wave between which the IDTs are sandwiched, for example, along the propagation direction of a surface acoustic wave.

The IDTs are made of a metal thin film of aluminum, and the IDTs function as a surface acoustic wave converter such that an input electrical AC signal is converted into a surface acoustic wave (elastic energy) to cause the surface acoustic wave to be propagated on the piezoelectric substrate, such that the propagated surface acoustic wave is converted into an electrical signal to output the signal. The reflectors reflect a propagated surface acoustic wave in the direction from which the surface acoustic wave came.

In such IDTs, the signal conversion characteristics and passband can be determined by setting the length and width of each electrode finger, the spacing between adjacent electrode fingers, and the cross width, that is, the facing length of adjacent electrode fingers in the comb-shaped electrodes. Furthermore, in the reflectors, the reflection characteristics can be set by adjusting the width of each electrode finger and the spacing between electrode fingers.

Also in such surface acoustic wave devices, the devices having an unbalanced-to-balanced conversion function are under development and being practically used. When the filtering characteristics having a high attenuation value is required outside the passband, a multi-stage construction in which surface acoustic wave elements which are longitudinally coupled are connected in series, as described in Japanese Unexamined Patent Application Publication No. 10-117123, is used.

SUMMARY OF THE INVENTION

In order to overcome the problems described above, preferred embodiments of the present invention provide a surface acoustic wave device having an unbalanced-to-balanced conversion function in which the balancing of the outputs is greatly improved on the balanced side or the unbalanced side.

According to a preferred embodiment of the present invention, a surface acoustic wave includes four surface acoustic wave elements, each of which has a plurality of comb-shaped electrode portions disposed along the propagation direction of a surface acoustic wave and reflectors located outside the comb-shaped electrode portions, on a piezoelectric substrate. In the surface acoustic wave device, an unbalanced-to-balanced conversion function is provided, and, in order to make the phase difference of the outputs on the balanced side substantially 180 degrees, a surface acoustic wave element, in which the phase is 180 degrees shifted between the input and output terminals, is disposed on the balanced side.

According to the above-described unique construction, the balancing of the balanced outputs or the unbalanced outputs is improved by disposing on the balanced side the surface acoustic wave elements in which the phase is inverted, that is, the phase is 180 degrees shifted between the input and output terminals.

In such a surface acoustic wave device, it is desirable that the longitudinal connection of the surface acoustic wave elements is a balanced connection. According to the above-described unique construction, the balancing of the balanced outputs or the unbalanced outputs is greatly improved by making the longitudinal connection of the surface acoustic wave elements a balanced connection.

In a surface acoustic wave device, it is desirable that the number of electrode fingers of at least one IDT is even. According to the above-described unique construction, the balancing of the balanced outputs or the unbalanced outputs is further improved by making the number of electrode fingers of at least one IDT even.

In such a surface acoustic wave device, it is desirable that the number of electrode fingers of the middle IDT sandwiched between other IDTs in the surface acoustic wave elements is even.

According to the above-described unique construction, the balancing of the balanced outputs or the unbalanced outputs is further improved by making the number of electrode fingers of the middle IDT even.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
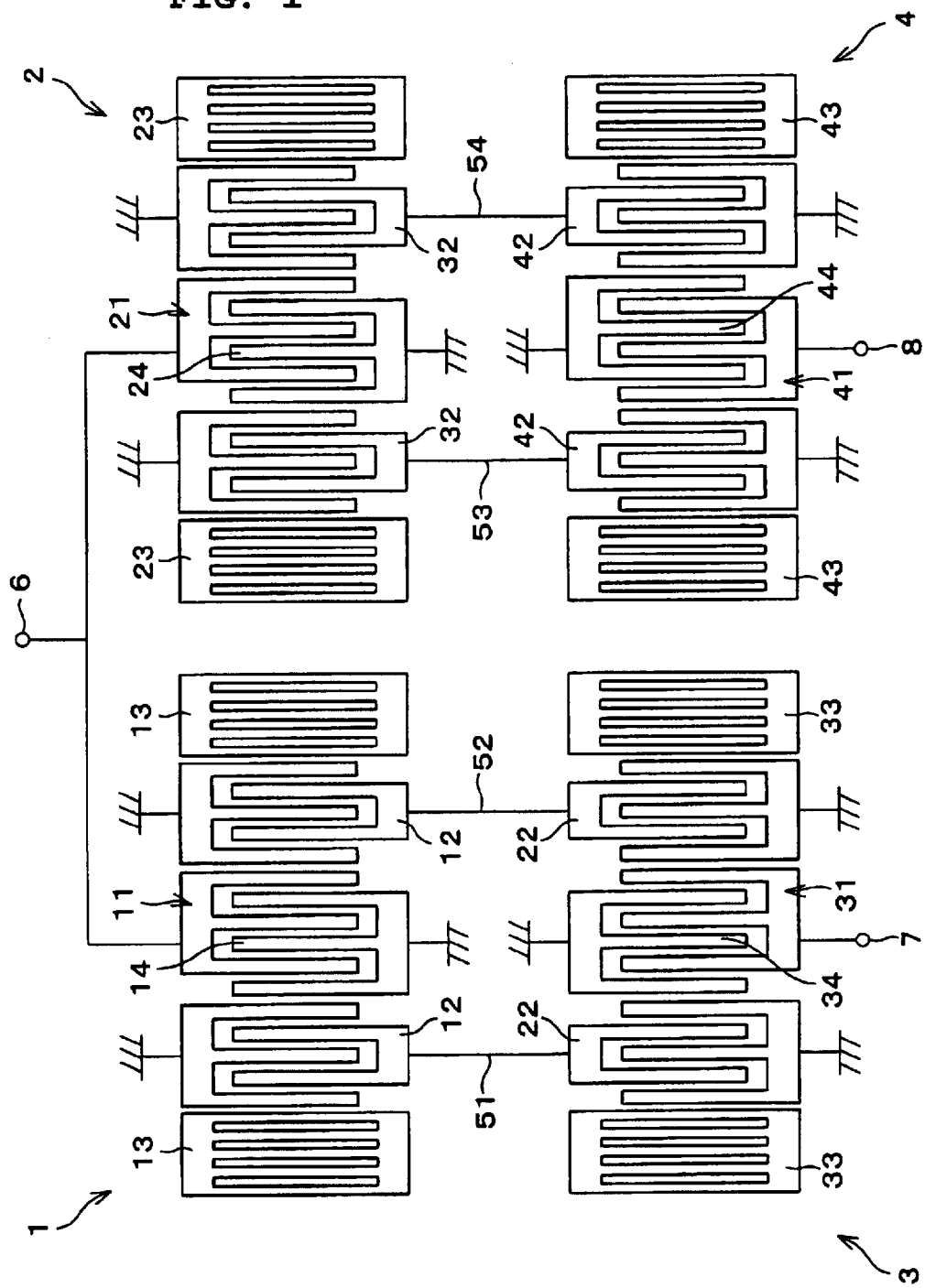
FIG. 1 is a schematic illustration of a surface acoustic wave device according to a preferred embodiment of the present invention.
Figure 2:
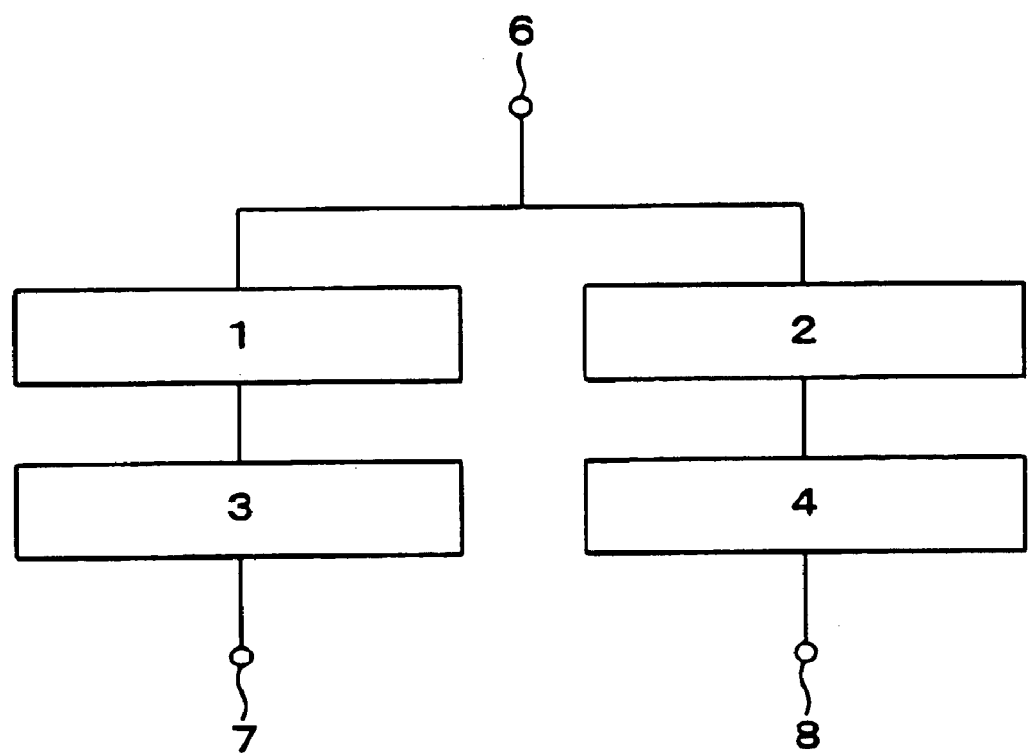
FIG. 2 shows the disposition of each surface acoustic wave element of the surface acoustic wave device according to a preferred embodiment of the present invention.

Hereinafter, preferred embodiments of the present invention are described with reference to FIGS. 1 to 13. FIGS. 1 and 2 show a preferred embodiment of the present invention. FIG. 1 is a schematic illustration of surface acoustic wave elements 1 to 4 in two stages of a surface acoustic wave device having a balanced-to-unbalanced conversion function. FIG. 2 shows the disposition of the four surface acoustic wave elements in the surface acoustic wave device.

In the surface acoustic wave device, as shown in FIGS. 1 and 2, the surface acoustic wave element 1 and the surface acoustic wave element 2 on the unbalanced side are connected in parallel to an unbalanced terminal 6, and the surface acoustic wave element 3 and the surface acoustic wave element 4 on the balanced side are connected in series to the surface acoustic wave element 1 and the surface acoustic wave element 2 on the unbalanced side, respectively.

Each of the surface acoustic wave elements 1, 2, 3, and 4 includes one of input-output IDTs 11, 21, 31, and 41, a pair of IDTs 12, 22, 32, and 42 sandwiching one of input-output IDTs 11, 21, 31, and 41, and a pair of reflectors 13, 23, 33, and 43 sandwiching a pair of input-output IDTs 11, 21, 31, and 41, respectively.

In the present preferred embodiment, the surface acoustic wave elements 1 to 3 are designed in the same way and the surface acoustic wave element 4 is designed so as to have a phase which is 180 degrees different from that of the surface acoustic wave elements 1 to 3. Furthermore, a series connection line 51 and a series connection line 52 are designed so as to be 180 degrees different in phase from each other and a series connection line 53 and a series connection line 54 are designed so as to be 180 degrees different in phase from each other, and the series connection between the surface acoustic wave element 1 and the surface acoustic wave element 3 and between the surface acoustic wave element 2 and the surface acoustic wave element 4 is a balanced connection.

The series connection lines 51 and 52 connect the series IDTs 12 and 22 facing each other, respectively. The series connection lines 53 and 54 connect the series IDTs 32 and 42 facing each other, respectively.

The electrode fingers of the input-output IDTs 14, 24, 34, and 44 for the surface acoustic wave elements 1, 2, 3, and 4 are even-numbered. The electrode fingers of the series IDTs 12, 22, 32, and 42 are odd-numbered.

The surface acoustic wave device according to a preferred embodiment of the present embodiment has the following parameters. The center frequency is 900 MHz, the number of electrode fingers of the input-output IDTs 14, 24, 34, and 44 is 34, that is, 17 pairs, and the number of electrode fingers of the series IDTs 12, 22, 32, and 42 is 27, that is, 13.5 pairs.

Next, the effect of the surface acoustic wave device according to the present preferred embodiment is described. FIG. 1 shows a surface acoustic wave device having an unbalanced-to-balanced conversion function. The output signals of the balanced terminals 7 and 8 are designed such that the amplitude balance is 0 dB and the phase difference showing the phase balance is 180 degrees in the passband. However, practically the amplitude balance does not become 0 dB and the phase difference showing the phase balance does not become 180 degrees.

In the case of a two-stage four-element construction as in the present preferred embodiment, the phase must be inverted in any one of the surface acoustic wave elements 1 to 4 and the difference of impedance, etc., is caused between the surface acoustic wave element in which the phase is inverted and the surface acoustic wave element in which the phase is not inverted, and, as a result, the balancing is deteriorated in the outputs on the balanced side.

According to a preferred embodiment of the present invention, in the surface acoustic wave device of multi-stage connection and having an unbalanced-to-balanced conversion function as described above, a construction, in which the asymmetry between the balanced terminals 7 and 8 is alleviated and the balances are good, is provided.

When the number of electrode fingers of the input-output IDTs 14, 24, 34, and 44 is even, even if the phase is inverted, since the number of electrode fingers on the grounded side is the same as that on the hot side (signal side), the above asymmetry is alleviated.

Moreover, when the balanced connection between the series connection line 51 and the series connection line 52 and between the series connection line 53 and the series connection line 54 is established so as to be 180 degrees different in phase from each other, the balancing is even more improved.

Figure 3:
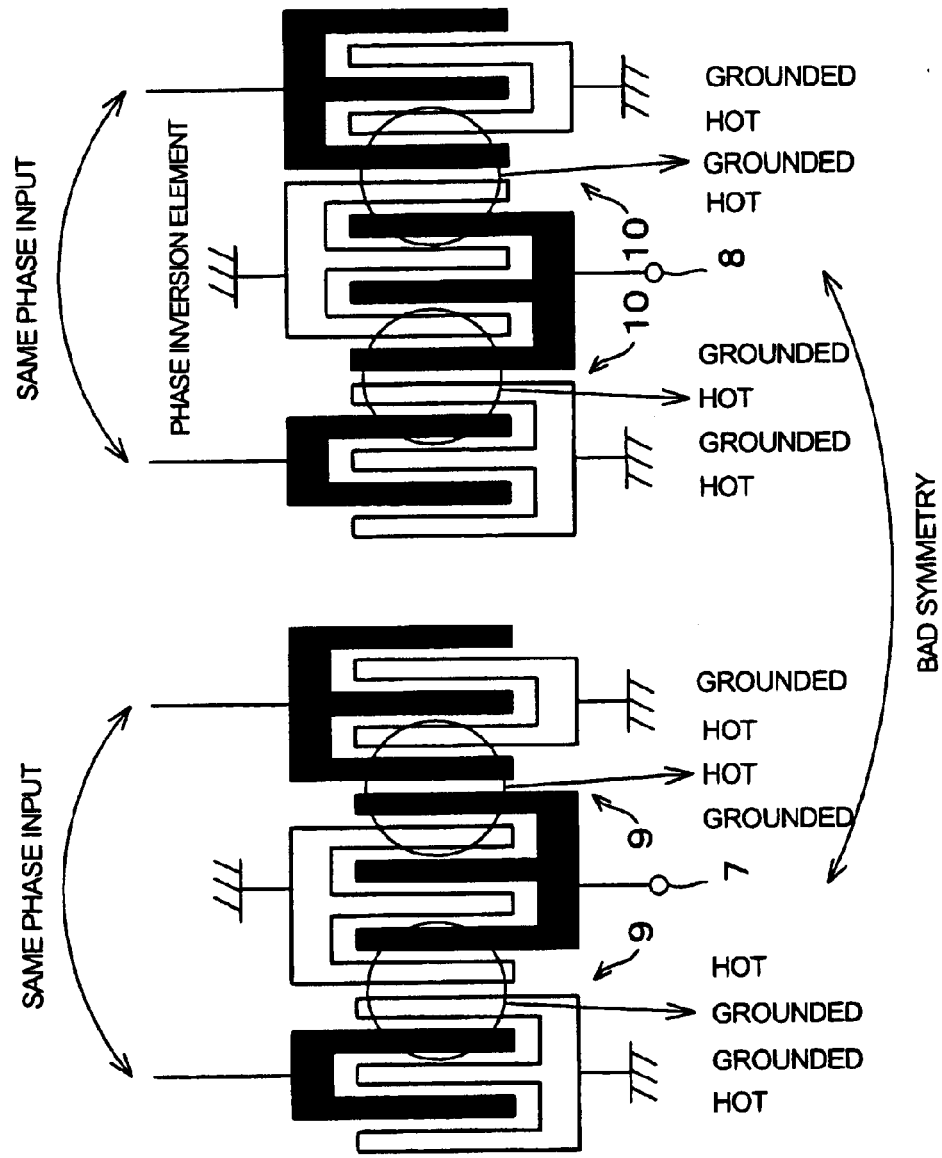
FIG. 3 is an illustration showing the bad symmetry of a surface acoustic wave device as an example for comparison to the present invention.
Figure 4:
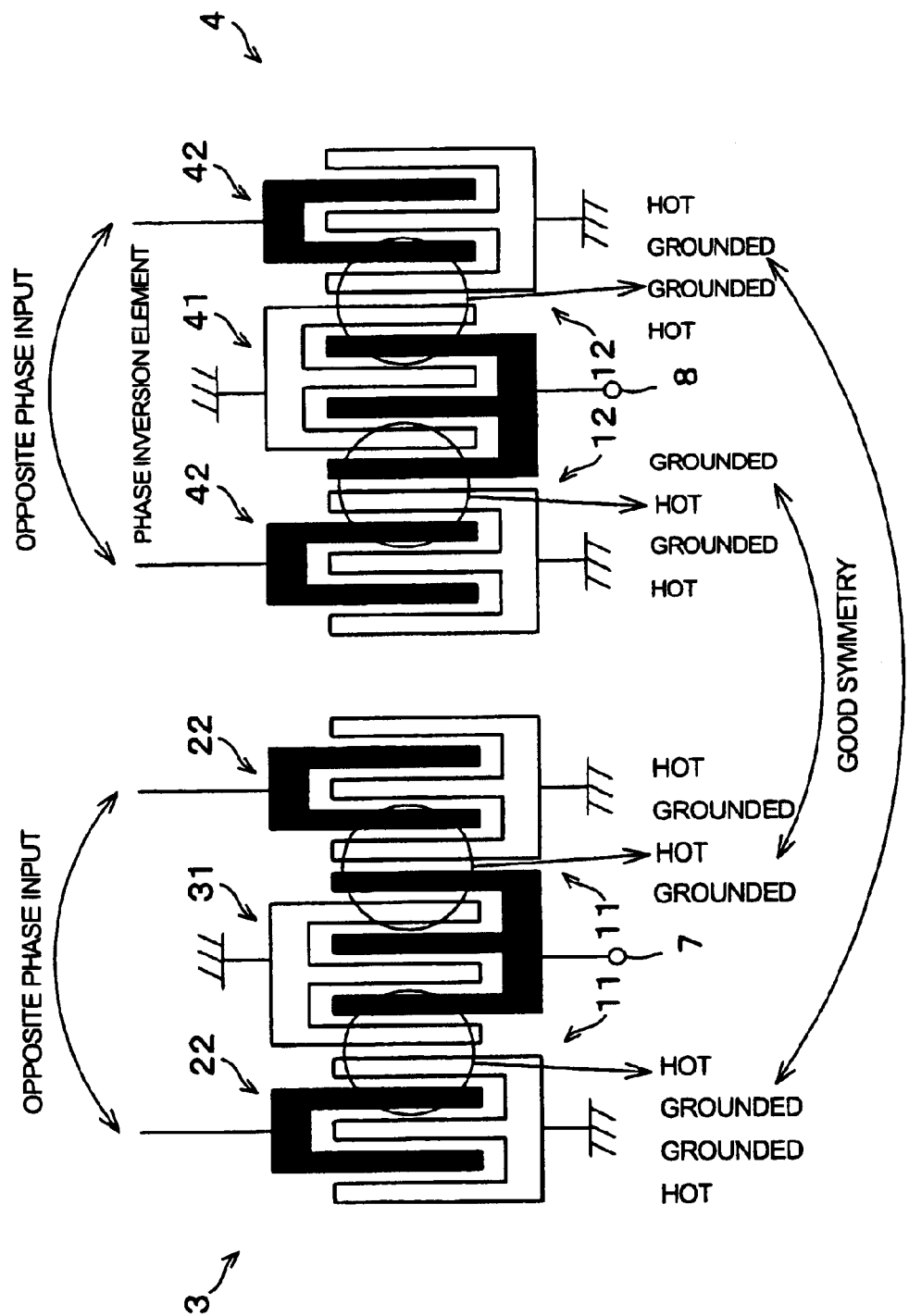
FIG. 4 is an illustration showing the good symmetry of the surface acoustic wave device according to a preferred embodiment of the present invention.

The reason for such improvement is as follows. As in an example for comparison, when no balanced connection is established as shown in FIG. 3, the symmetry between the arrangements 9 of grounded and hot lines in the IDTs of an element where the phase is not inverted and the arrangements 10 of grounded and hot lines in the IDTs of an element where the phase is inverted is bad, but when the balanced connection is established as in the present preferred embodiment in FIG. 4, the symmetry between the arrangements 11 of grounded and hot lines in the IDTs of an element where the phase is not inverted and the arrangements 12 of grounded and hot lines in the IDTs of an element where the phase is inverted is improved.

That is, in the surface acoustic wave elements 3 and 4 on the balanced side of the present preferred embodiment, it is desirable that the arrangement of the portions (outermost electrode fingers and at least electrode fingers next to the outermost electrode fingers) facing each other, each of which is grounded or hot, of the IDTs that are adjacent to each other, that is, of the IDT 31 and each of the IDTs 22 and the IDT 41 and each of the IDTs 42 is symmetrical with respect to an imaginary symmetry line which passes through the center between the input-output IDTs 31 and 42 along the propagation direction of a surface acoustic wave and which is substantially perpendicular to the propagation direction of a surface acoustic wave.

However, the problem of the structural asymmetry is not completely solved, and the balancing is dependent on the arrangement of the elements. Then, it was experimentally confirmed that the balancing is improved by providing a surface acoustic wave element in which the phase is inverted in a stage on the balanced terminal side such as the surface acoustic wave element 3 or the surface acoustic wave element 4 in FIG. 4.

The connection of the phase inversion element to the element in which the phase is not inverted when the phase inversion element is disposed on the unbalanced side is different from the connection when the phase inversion element is disposed on the balanced side, and the connection is in parallel on the unbalanced side and is in series on the balanced side. The reason why the balancing is improved by disposing the phase inversion element on the balanced side rather than on the unbalanced side is that the difference of characteristics of each element such as phase, amplitude, etc., has less effect when connected in series than when connected in parallel.

In the present preferred embodiment, as described above, a surface acoustic wave device of multi-stage connection and having an unbalanced-to-balanced conversion function, in which the asymmetry between the balanced terminals 7 and 8 is alleviated and the balancing is good, can be provided.

Figure 5:
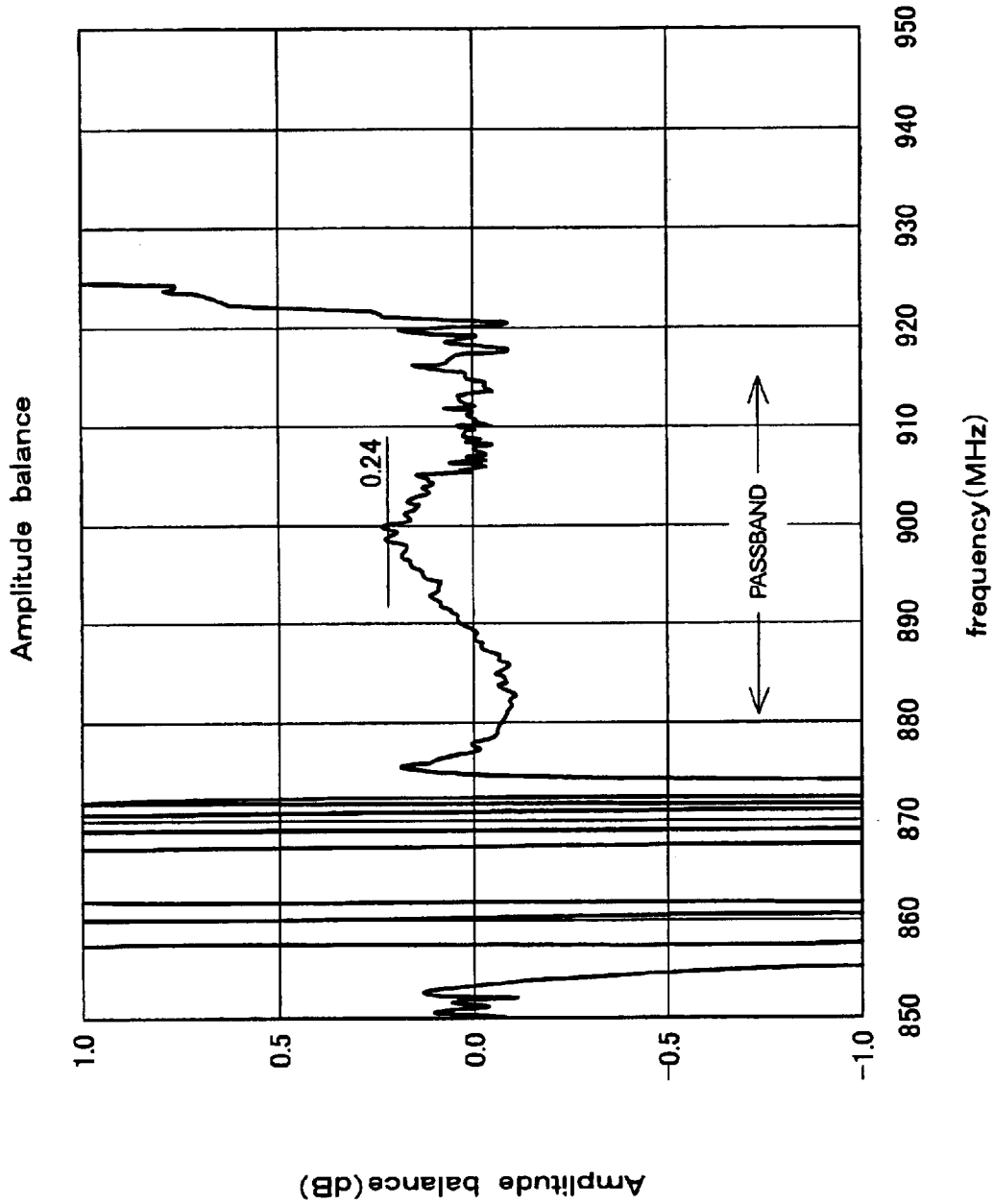
FIG. 5 shows a graph showing the amplitude balance of the surface acoustic wave device as an example for comparison to the present invention.
Figure 6:
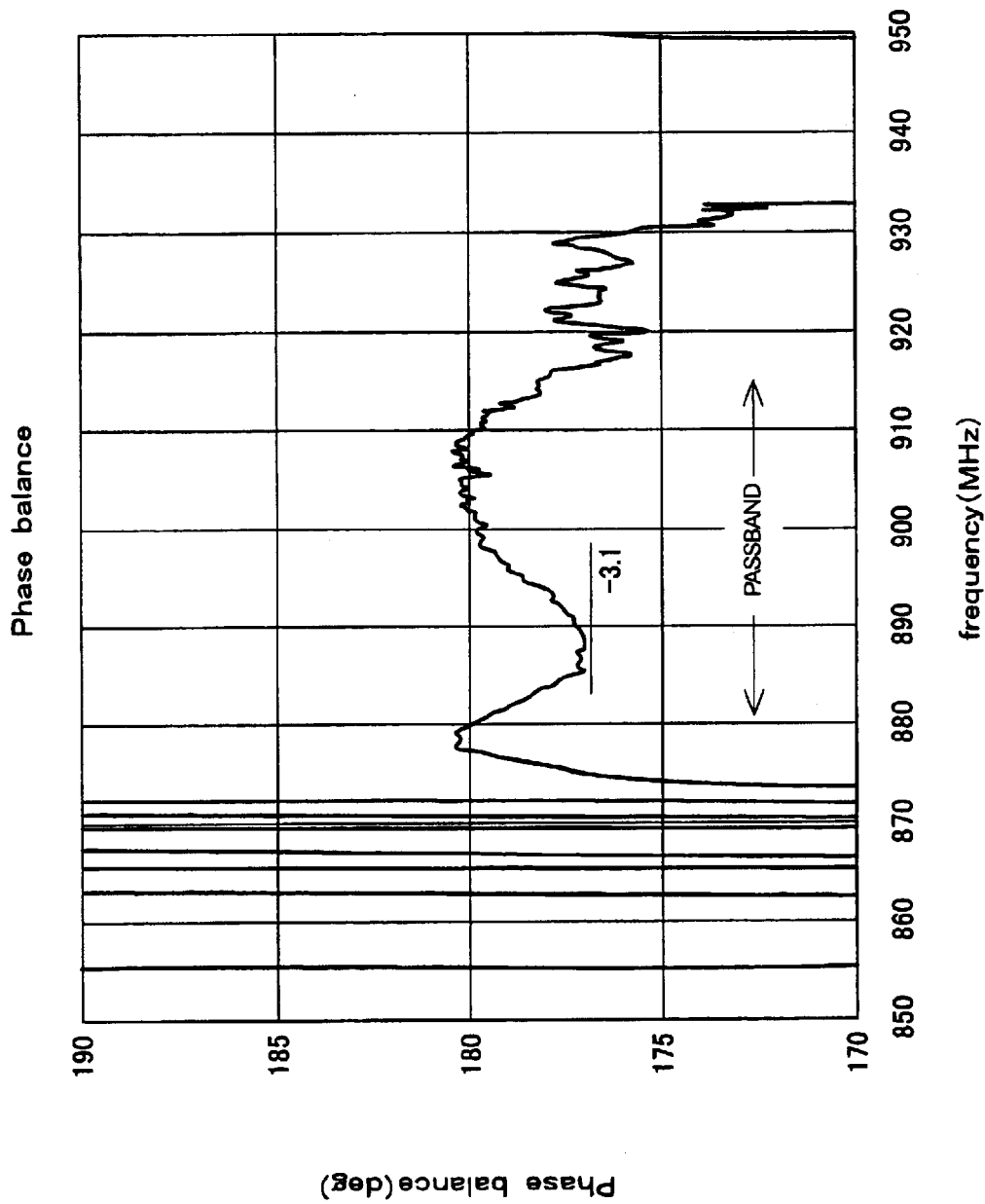
FIG. 6 shows a graph showing the phase balance of the surface acoustic wave device as an example for comparison to the present invention.
Figure 7:
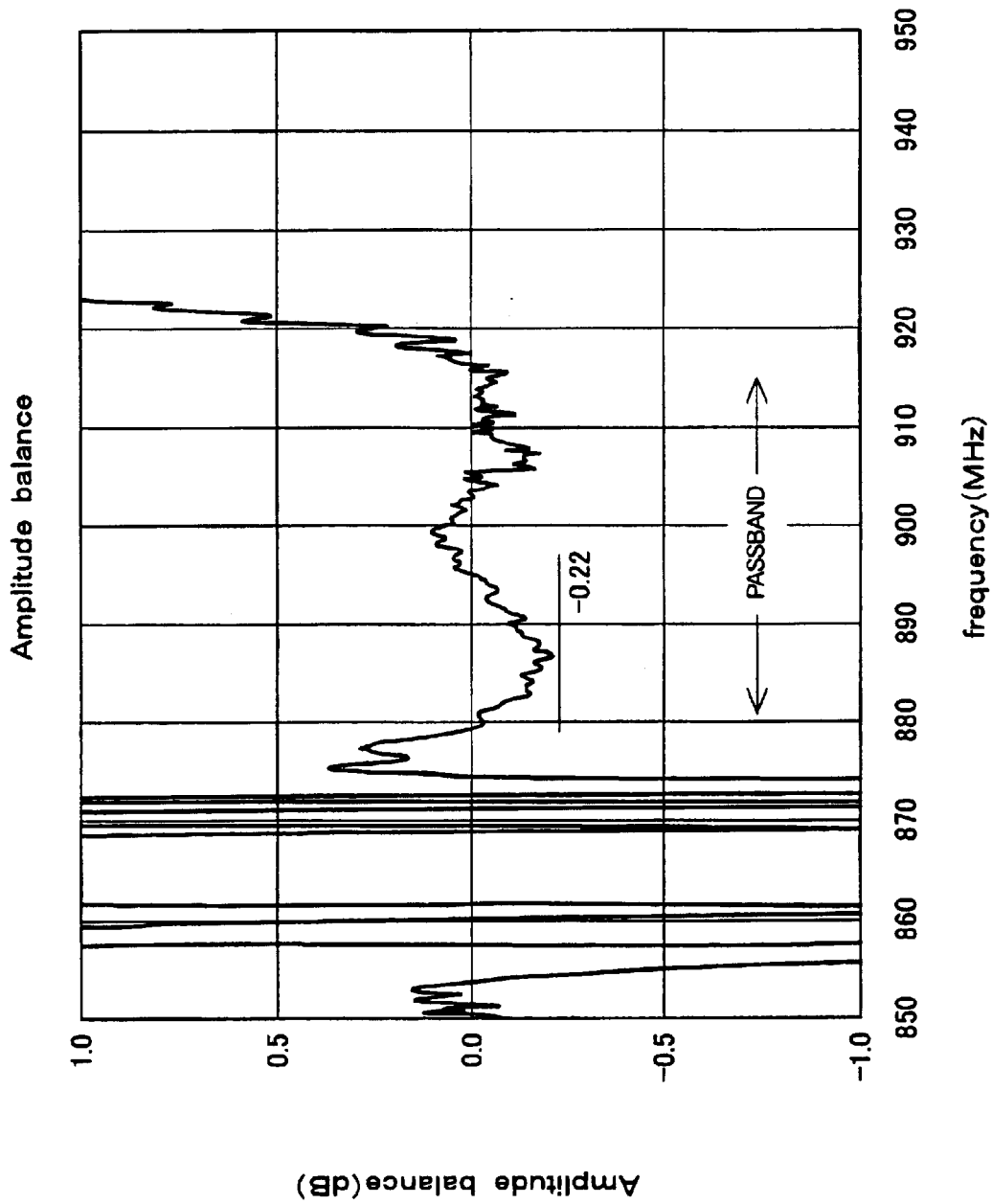
FIG. 7 shows a graph showing the amplitude balance of the surface acoustic wave device according to a preferred embodiment of the present invention.
Figure 8:
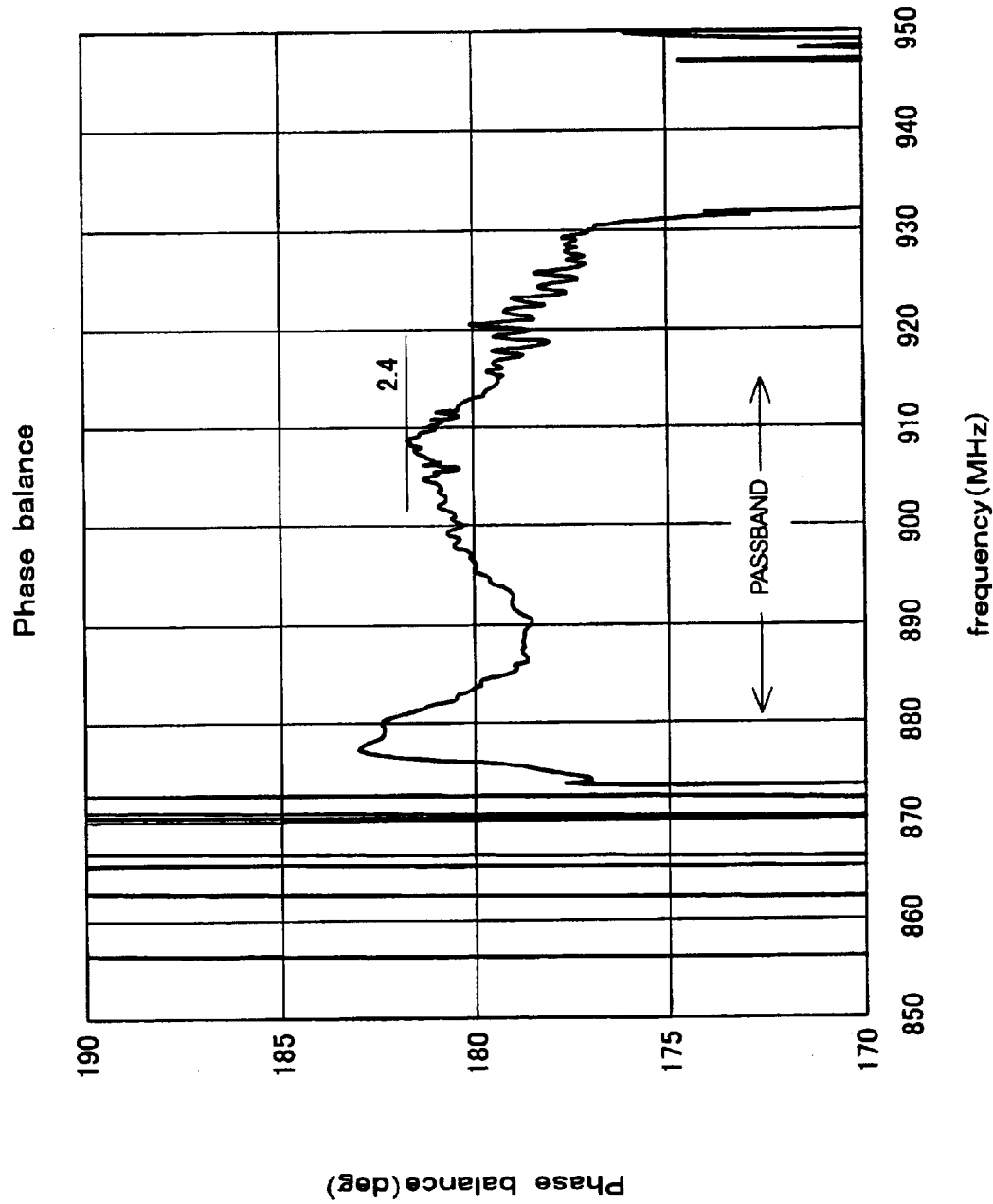
FIG. 8 shows a graph showing the phase balance of the surface acoustic wave device according to a preferred embodiment of the present invention.
Figure 9:
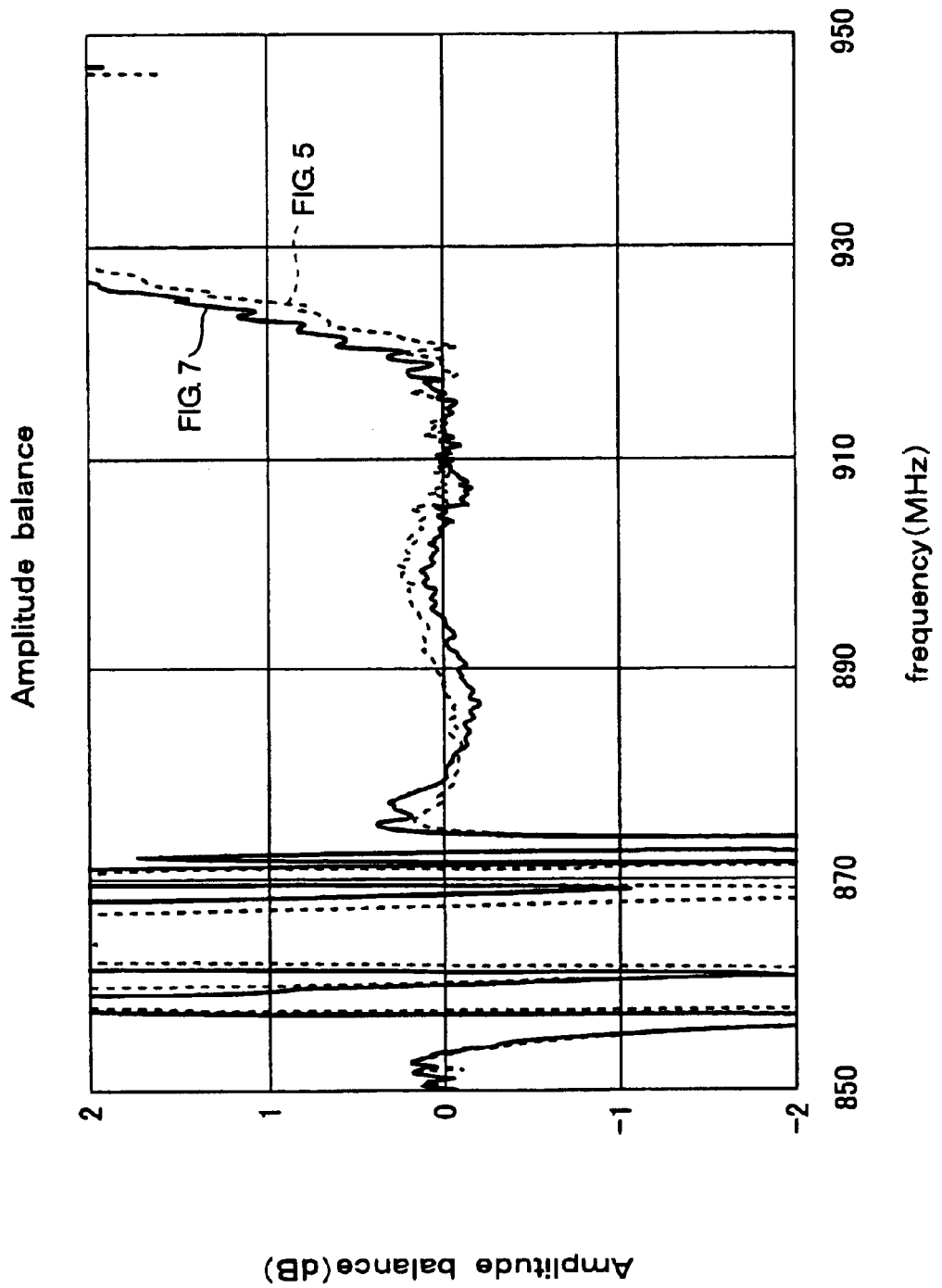
FIG. 9 is a graph showing the amplitude balance of the surface acoustic wave devices to show the results in FIGS. 5 and 7 together.
Figure 10:
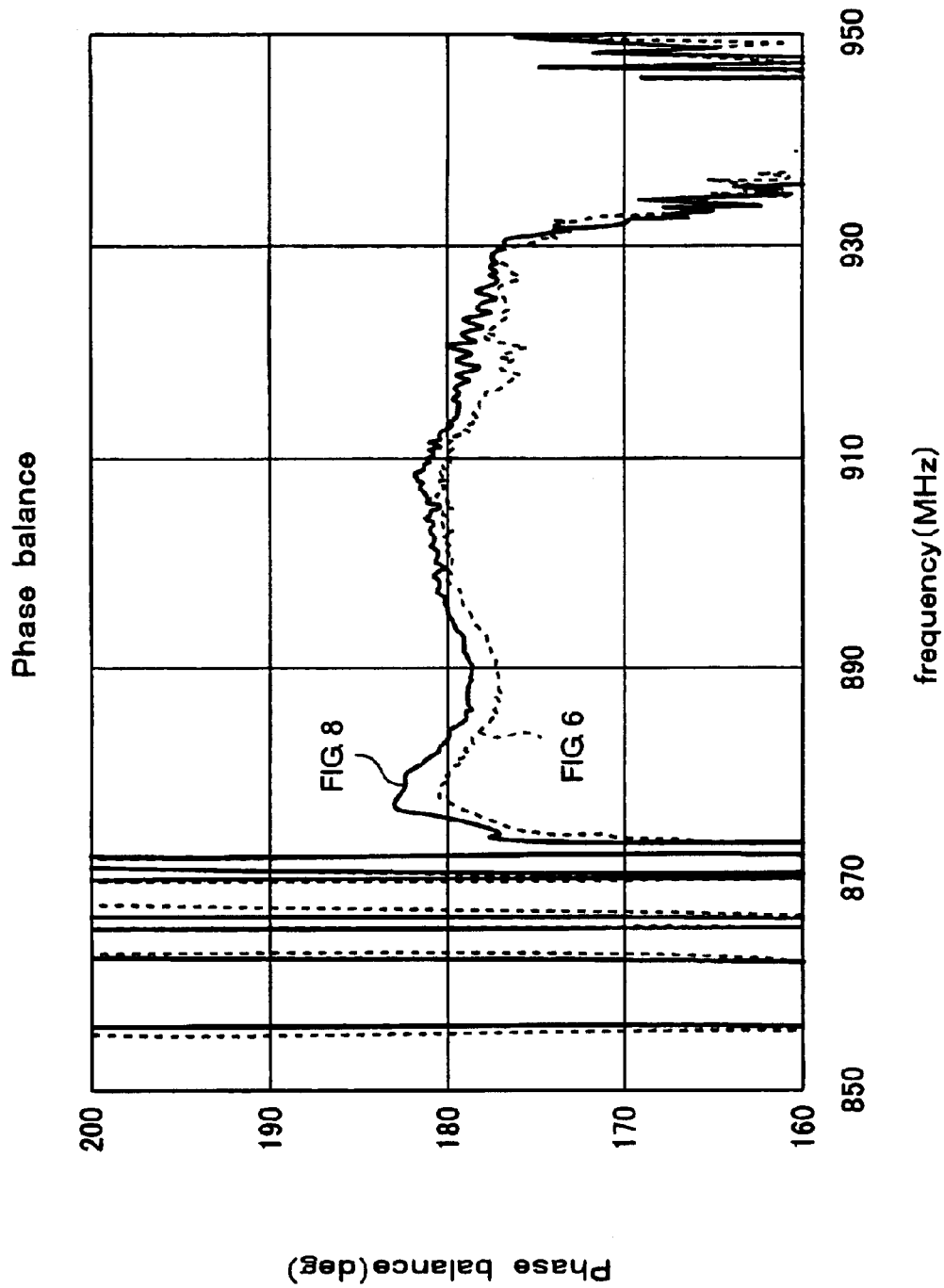
FIG. 10 is a graph showing the phase balance of the surface acoustic wave devices to show the results in FIGS. 6 and 8 together.

FIGS. 5 to 10 show balance characteristics around the passband. The amplitude balance of the example for comparison in which the surface acoustic wave element 2 in FIG. 1 is a phase inversion element is shown in FIG. 5 and the phase balance is shown in FIG. 6. The amplitude balance of the present preferred embodiment in which the surface acoustic wave element 4 is a phase conversion element is shown in FIG. 7 and the phase balance is shown in FIG. 8. For easier comparison, the combination of FIGS. 5 and 7 is shown in FIG. 9 in which the broken line represents FIG. 5 and the solid line represents FIG. 7, and the combination of FIGS. 6 and 8 is shown in FIG. 10 in which the broken line represents FIG. 6 and the solid line represents FIG. 8.

The balancing in the passband of the balanced outputs of a surface acoustic wave device is generally determined by the absolute value of a maximum displacement from an ideal value. As clearly understood in FIGS. 5 to 10, when the phase inversion element is provided on the balanced side, the balancing, the phase balance in particular, is improved such that, in the example for comparison, the amplitude balance is 0.24 dB (FIG. 5) and the phase difference showing the phase balance is 3.1 degrees (FIG. 6) and that, in the present embodiment, the amplitude balance is about 0.22 dB (FIG. 7) and the phase difference showing the phase balance is about 2.4 degrees (FIG. 8).

Moreover, in the present preferred embodiment, although the surface acoustic wave element 4 is preferably a phase inversion element, for example, the other surface acoustic wave element 3 may be made a phase inversion element without limiting the arrangement to the above-described construction.

Figure 11:
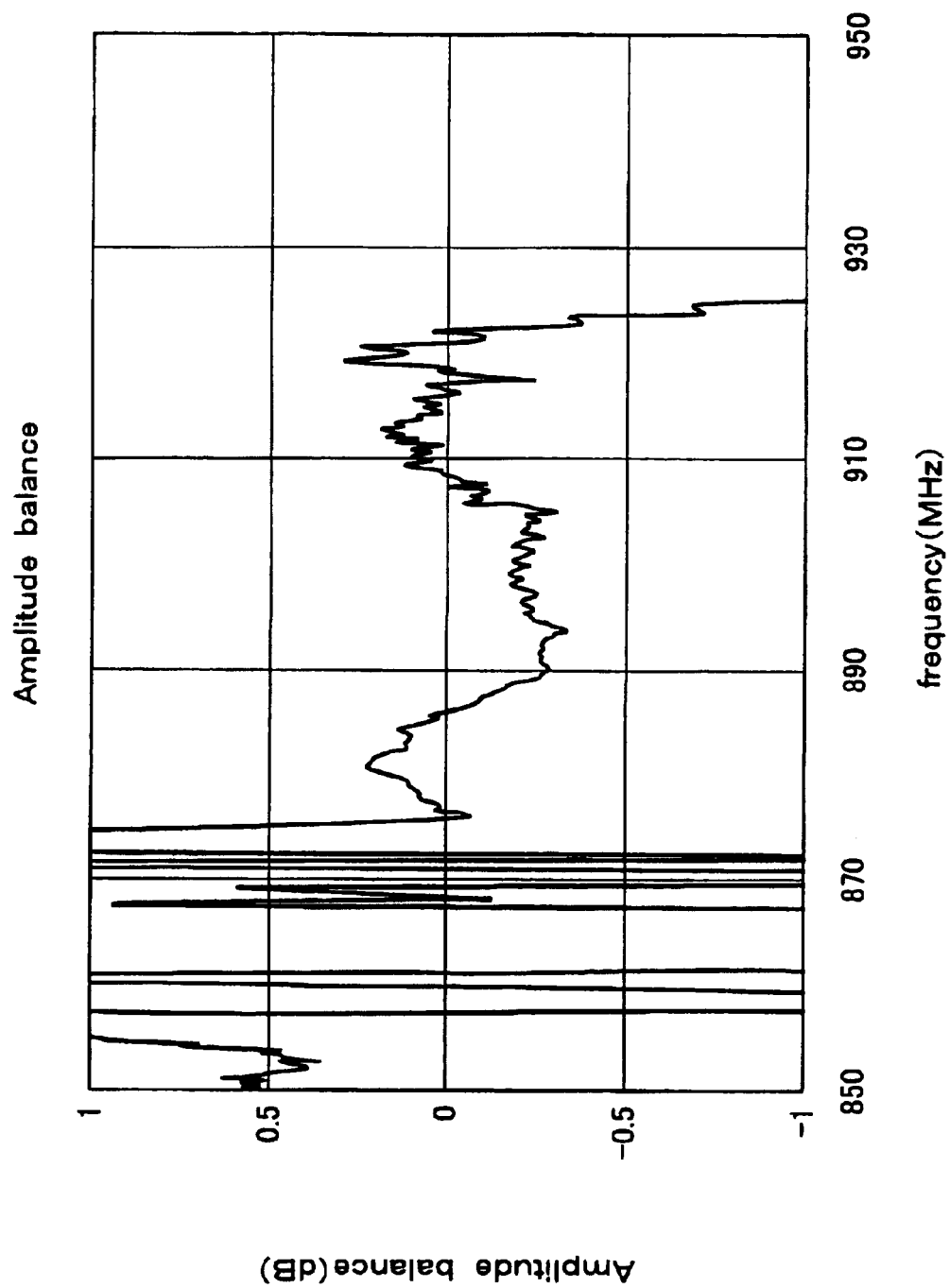
FIG. 11 is a graph showing the amplitude balance of a modified surface acoustic wave device according to a preferred embodiment of the present invention.
Figure 12:
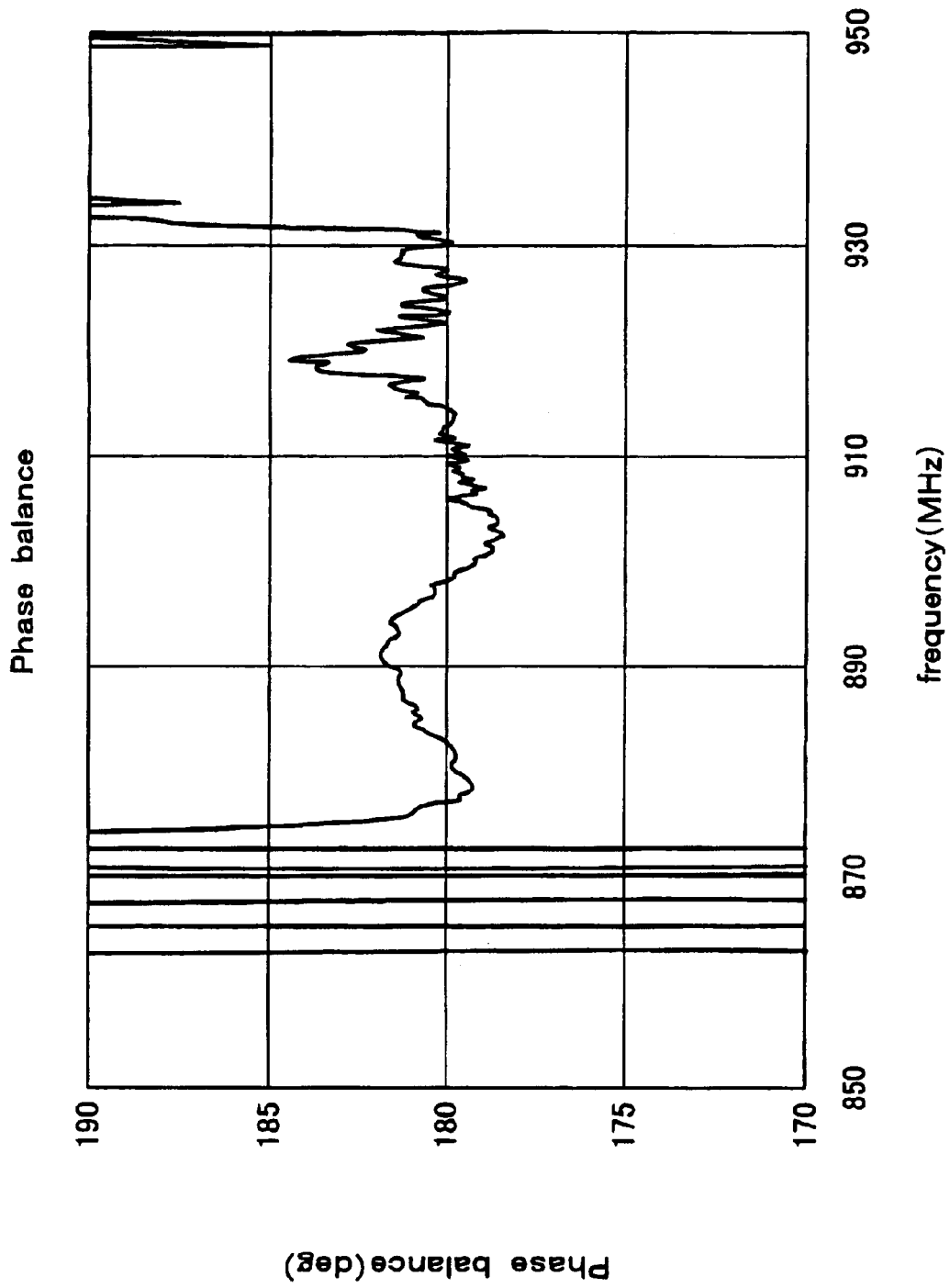
FIG. 12 is a graph showing the phase balance of a modified surface acoustic wave device according to a preferred embodiment of the present invention.

In a modified example of the present preferred embodiment in which the surface acoustic wave element 3 is a phase inversion element, as shown in FIG. 11 (amplitude balance) and in FIG. 12 (phase balance), it is understood that the balancing, the phase balance in particular, is improved by providing a phase inversion element on the balanced side.

Furthermore, in the above description, an example in which the unbalanced terminal 6 is on the input side and the balanced terminals 7 and 8 are on the output side is provided, but, on the contrary, even if the balanced terminals 7 and 8 are on the input side and the unbalanced terminal 6 is on the output side, since the balancing in the balanced-to-unbalanced conversion is considered to be identical with the balancing in the unbalanced-to-balanced, the present invention achieves the same effect.

Figure 13:
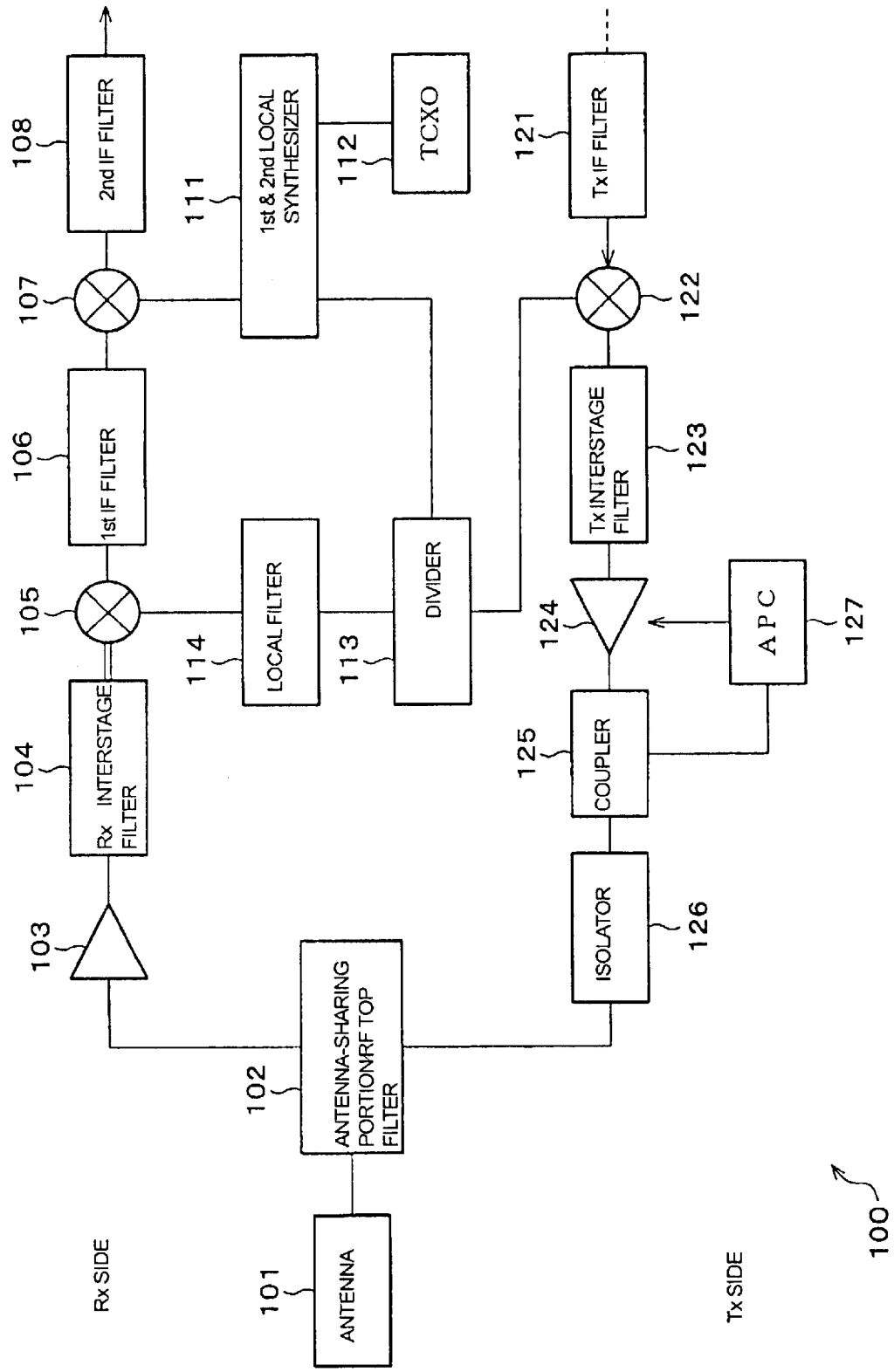
FIG. 13 is a block diagram of a communication device including a surface acoustic wave device according to a preferred embodiment of the present invention.

Hereinafter, a communication device 100, in which a surface acoustic wave device according to the present preferred embodiment is mounted, is described with reference to FIG. 13.

In the communication device 100, a receiver for receiving signals on the Rx side includes an antenna 101, an antenna-sharing portion/RF top filter 102, an amplifier 103, an Rx interstage filter 104, a mixer 105, a first IF filter 106, a mixer 107, a second IF filter 108, a first and second local synthesizer 111, a TCXO (temperature compensated crystal oscillator) 112, a divider 113, and a local filter 114. As shown by a double line in FIG. 13, it is desirable to transmit balanced signals from the Rx interstage filter 104 to the mixer 105 in order to reliably achieve balancing.

Furthermore, in the communication device 100, a transmitter for transmitting signals on the Tx side includes the antenna 101, the antenna-sharing portion/RF top filter 102, a Tx IF filter 121, a mixer 122, a Tx interstage filter 123, an amplifier 124, a coupler 125, an isolator 126, and an APC (automatic power control) 127.

Then, the surface acoustic wave devices according to the present preferred embodiment described above are appropriately used for the above Rx interstage filter 104, first IF filter 106, Tx IF filter 121, and Tx interstage filter 123.

Accordingly, in the above-described communication device, since the surface acoustic wave devices included therein can be improved in the balancing of the balanced and unbalanced outputs when compared with the related devices, a smaller-size and high-performance communication device having a GHz or higher passband in particular can be realized.

As described above, a surface acoustic wave device according to preferred embodiments of the present invention has four or more surface acoustic wave elements and an unbalanced-to-balanced conversion function and, in the surface acoustic wave device, a surface acoustic wave element in which the phase is 180 degrees shifted between the input and output terminals is disposed on the balanced side in order to make the phase difference between the outputs on the balanced side substantially 180 degrees.

Therefore, in the above-described construction, the balancing of the balanced and unbalanced outputs is greatly improved such that a surface acoustic wave element, in which the phase is inverted, that is, the phase between the input and output terminals is 180 degrees shifted, is disposed on the balanced side.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device comprising:

a piezoelectric substrate;

an unbalanced terminal;

balanced terminals; and at least four surface acoustic wave elements, each of which has a plurality of comb-shaped electrode portions arranged along a propagation direction of a surface acoustic wave and reflectors disposed outside the comb-shaped electrode portions, on said piezoelectric substrate; wherein the plurality of comb-shaped electrode portions of each of the least four surface acoustic wave elements includes an input-output IDT disposed along the propagation direction, series IDTs which sandwich said input-output IDT and reflectors which sandwich said series IDTs and said input-output IDT;

first and third surface acoustic wave elements of said at least four surface acoustic wave elements are longitudinally connected, and second and fourth surface acoustic wave elements of said at least four surface acoustic wave elements are longitudinally connected, the first and second surface acoustic wave elements define a first stage and the third and fourth surface acoustic wave elements define a second stage;

one end of each of the first and second surface acoustic wave elements is connected to the unbalanced terminal and one end of each of the third and fourth surface acoustic wave elements is connected to the balanced terminals;

one end of a left series IDT of the first acoustic wave element and one end of a left side series IDT of the third surface acoustic wave element are connected to each other by a first series conection line, and one end of a left side series IDT of the second surface acoustic wave element and one end of a left side series IDT of the fourth surface acoustic wave element are connected to each other by a second series connection line;

one end of a right side series IDT of the first surface acoustic wave element and one end of a right side series IDT of the third surface acoustic wave element are connected to each other by a third series connection line, and one end of a right side IDT of the second surface acoustic wave element and one end of a right side IDT of the fourth surface acoustic wave element are connected to each other by a fourth series connection line;

an unbalanced-to-balanced conversion function is included and wherein, in order to make the phase difference of the outputs on the balanced side substantially 180 degrees, one of the least four surface acoustic wave elements in which the phase is 180 degrees shifted between the input and output terminals, is disposed on the balanced side; and the first and second series connection lines are arranged so as to be substantially 180 degrees different in phase from each other, and the third and fourth series connection lines are arranged so as to be substantially 180 degrees different in phase from each other.

2. A surface acoustic wave device as claimed in claim 1, wherein the longitudinal connection between the at least four surface acoustic wave elements is a balanced connection.

3. A surface acoustic wave device as claimed in claim 1, wherein, in each of the at least four surface acoustic wave elements, the number of electrode fingers of at least one comb-shaped electrode portion is even.

4. A surface acoustic wave device as claimed in claim 1, wherein, in each of the at least four surface acoustic wave elements, the number of electrode fingers in the middle comb-shaped electrode portion sandwiched between other comb-shaped electrode portions is even.

5. A surface acoustic wave device as claimed in claim 1, wherein a first pair of the at least four surface acoustic wave elements on the unbalanced side are connected in parallel to an unbalanced terminal.

6. A surface acoustic wave device as claimed in claim 5, wherein a second pair of the at least four surface acoustic wave elements on the balanced side are connected in series to the first pair of the at least four the surface acoustic wave elements.

7. A surface acoustic wave device as claimed in claim 1, wherein at least one of the at least four surface acoustic wave elements is a phase inversion element.

8. A surface acoustic wave device as claimed in claim 7, wherein said at least one of the at least four surface acoustic wave elements that is a phase inversion element is located on the balanced side.

9. A surface acoustic wave device as claimed in claim 1, wherein the unbalanced terminal is on an input side and the balanced terminals are on an output side.

10. A surface acoustic wave device as claimed in claim 1, wherein the unbalanced terminal is on an output side and the balanced terminals are on an input side.

11. A communication device comprising a surface acoustic wave device according to claim 1.

* * * * *